(12) United States Patent
Ozawa (10) Patent No.: US 6,479,325 B2
(45) Date of Patent: Nov. 12, 2002

(54) METHOD OF STACKING SEMICONDUCTOR LASER DEVICES IN A SUB-MOUNT AND HEATSINK

(75) Inventor: Masafumi Ozawa, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/729,210

(22) Filed: Dec. 5, 2000

(65) Prior Publication Data

US 2001/0002917 A1 Jun. 7, 2001

(30) Foreign Application Priority Data

Dec. 7, 1999 (JP) .......................... 11-347119

(51) Int. Cl.⁷ ............................................ H01L 21/48
(52) U.S. Cl. ...................... 438/119; 438/121; 438/122
(58) Field of Search ................ 372/43, 75, 36, 372/44, 46; 438/118, 119, 121, 122, 125, 26, 51, 106, 109, 107; 257/706, 707, 712, 717, 720, 713

(56) References Cited

U.S. PATENT DOCUMENTS

| | | | | |
|---|---|---|---|---|
| 3,961,996 A | * | 6/1976 | Namizaki et al. | 148/371 |
| 5,636,234 A | * | 6/1997 | Takagi | 372/43 |
| 5,638,391 A | * | 6/1997 | Shima et al. | 372/44 |
| 5,729,561 A | * | 3/1998 | Hironaka | 372/36 |
| 6,172,382 B1 | * | 1/2001 | Nagahama et al. | 257/94 |
| 6,185,238 B1 | * | 2/2001 | Onomura et al. | 372/46 |
| 6,195,375 B1 | * | 2/2001 | Hirata | 372/46 |
| 6,301,278 B2 | * | 10/2001 | Uchida | 372/36 |
| 6,303,405 B1 | * | 10/2001 | Yoshida et al. | 438/46 |

FOREIGN PATENT DOCUMENTS

| | | | |
|---|---|---|---|
| JP | 56-27988 | * | 3/1981 |
| JP | 62-252186 | * | 11/1987 |
| JP | 2-278783 | * | 11/1990 |
| JP | 4-72688 | * | 3/1992 |
| JP | 4-186688 | * | 7/1992 |
| JP | 5-21870 | * | 1/1993 |
| JP | 5-41563 | * | 2/1993 |
| JP | 5-102602 | * | 4/1993 |
| JP | 6-283807 | * | 10/1994 |
| JP | 7-235729 | * | 8/1995 |
| JP | 8-228044 | * | 9/1996 |
| JP | 8-264898 | * | 10/1996 |
| JP | 11-54850 | * | 2/1999 |
| JP | 2001 127372 | * | 5/2001 |
| JP | 2001 135885 | * | 5/2001 |

* cited by examiner

Primary Examiner—Kamand Cuneo
Assistant Examiner—Alonzo Chambliss
(74) Attorney, Agent, or Firm—Rader, Fishman & Grauer PLLC; Ronald P. Kananen, Esq.

(57) ABSTRACT

A method of manufacturing a semiconductor laser device includes the steps of: providing a laser chip, in which a semiconductor layer is formed on a substrate, a supporting plate which supports the laser chip, a mounting plate, a first solder film positioned between the laser chip and the mounting plate and a second solder film positioned between the mounting plate and the supporting plate to form a stacked laser chip structure; applying heat to the stacked laser chip structure sufficient to melt the first solder film and the second solder film; and, applying pressure to the stacked laser chip structure during the heating step to cause simultaneous adhering of the laser chip, the mounting plate and the supporting plate to each other.

12 Claims, 5 Drawing Sheets

METHOD OF STACKING SEMICONDUCTOR LASER DEVICES IN A SUB-MOUNT AND HEATSINK

BACKGROUND OF THE INVENTION

1. Field of the Invention

The present invention relates to a method of manufacturing a semiconductor laser device including a laser chip in which a semiconductor layer and electrode films are formed on the same surface of a substrate, and a mounting plate and a supporting plate which are used in the method of manufacturing a semiconductor laser device.

2. Description of the Related Art

In recent years, semiconductor light-emitting devices including a semiconductor laser device in which a nitride semiconductor such as GaN is employed as a light source for short-wavelength lights have been developed.

Generally, with the semiconductor laser device utilizing the nitride semiconductor, an n-type layer, an active layer and a p-type layer, which are made of the nitride semiconductor, are stacked in sequence on a substrate made of sapphire ($Al_2O_3$). Among a pair of electrode films of the semiconductor laser device, a p-side electrode is formed on the p-type layer which is the most upper layer in the semiconductor layer, while an n-type electrode is formed on the n-type layer which is exposed by etching the p-type layer and the active layer. Here, the substrate, the semiconductor layer, the p-side electrode and the n-side electrode are collectively called a laser chip.

In general, the laser chip is supported by a supporting plate (also referred to as a heat sink) made of a metal with relatively high thermal conductivity, in order for the semiconductor layer to release generated heat effectively. Further, a mounting plate (also referred to as a sub-mount) is provided between the laser chip and the supporting plate, the mounting plate having a lead electrode on a supporting body made with an insulating material. With the conventional method of manufacturing a semiconductor laser device, a solder adheres the mounting plate to the supporting plate and then another solder adheres the mounting plate to the laser chip.

However, with such a conventional method of manufacturing a semiconductor laser device, two steps of adhesion process need to be performed, which creates a problem such that longer time for manufacturing a semiconductor laser device is required. Further, two steps of heating process are needed in order to melt the solder, which causes deterioration in performance of the semiconductor laser device due to repetition of heating.

SUMMARY OF THE INVENTION

The present invention has been achieved in view of the above problems. It is an object of the invention to provide a method of manufacturing a semiconductor laser device capable of reducing time required for manufacture and suppressing deterioration in performance due to heating, and a mounting plate and a supporting plate.

The method of manufacturing a semiconductor laser device of the present invention includes a step for simultaneously adhering a laser chip, a mounting plate and a supporting plate to each other.

The mounting plate of the semiconductor laser device of the present invention adheres to the laser chip, in which a semiconductor layer is formed on a substrate, for use, the mounting plate including a supporting body and a first solder film and a second solder film, each of which are formed on each of a pair of surfaces of the supporting body.

The supporting plate of the semiconductor laser device of the present invention supports the laser chip, which includes a semiconductor layer, having a predetermined mounting plate in between, the supporting plate including a solder film at least on one surface of the body.

With the method of manufacturing a semiconductor laser device of the present invention, the laser chip, the mounting plate and the supporting plate simultaneously adheres to each other, whereby two steps of adhesion process are not needed.

With the mounting plate of the semiconductor laser device of the present invention, the laser chip is placed on one surface of the mounting plate and the supporting plate is placed on the other surface of the mounting plate, thus the first solder film adheres the laser chip to the mounting plate, and simultaneously the second solder film adheres the mounting plate to the supporting plate.

With the supporting plate of the semiconductor laser device of the present invention, the mounting plate is placed on one surface of the supporting plate, whereby the solder film adheres the mounting plate to the supporting plate.

Other and further objects, features and advantages of the invention will appear more fully from the following description.

DETAILED DESCRIPTION OF THE PREFERRED EMBODIMENTS

Embodiments of the present invention will be described hereinafter with reference to accompanying drawings.

First Embodiment

Figure 1:
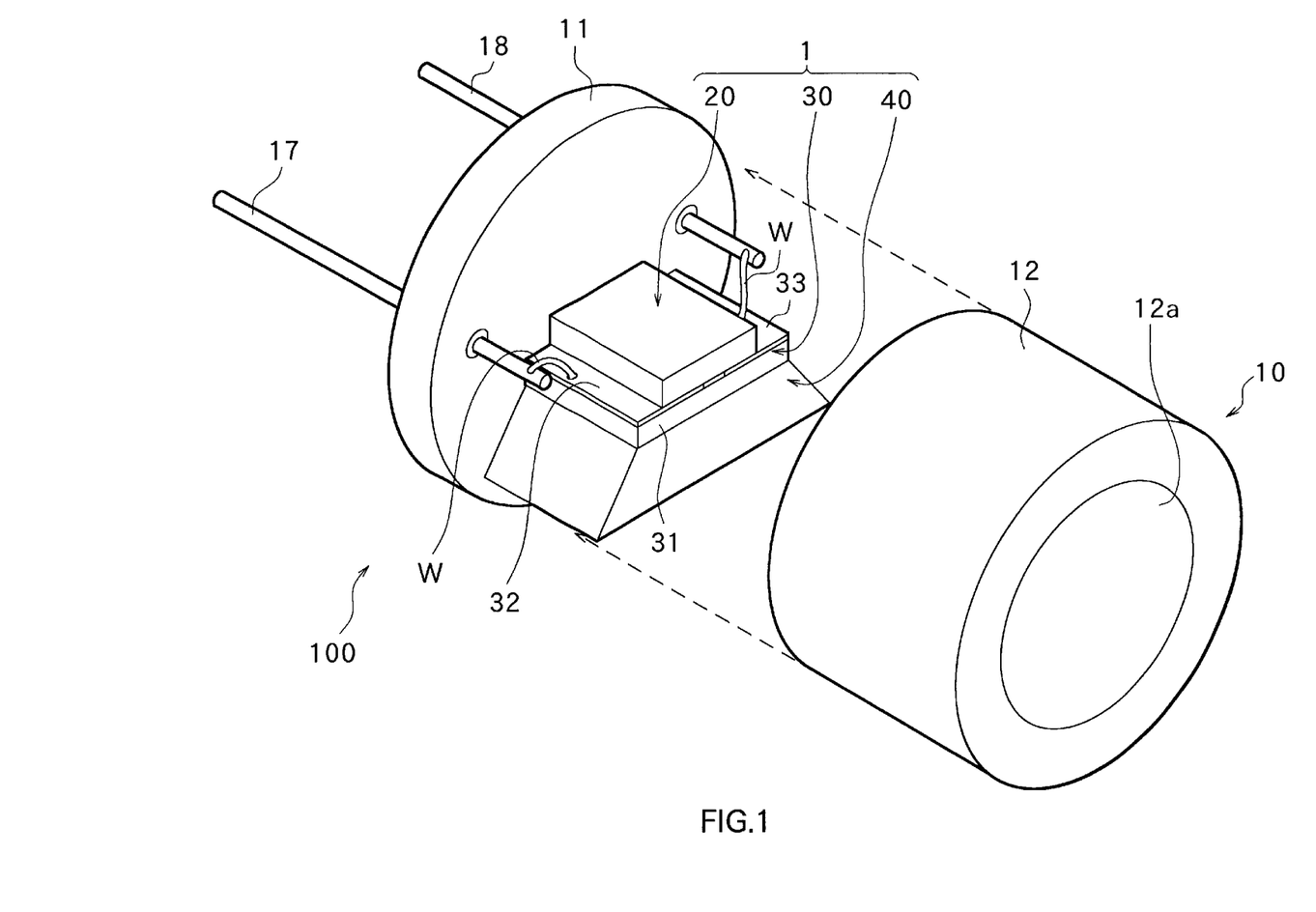
FIG. 1 is a perspective view showing the structure of a semiconductor light-emitting device in which a semiconductor laser device of an embodiment of the present invention is employed.

FIG. 1 shows one example of a semiconductor light-emitting device 100 in which a semiconductor laser device 1 is employed according to a first embodiment. The semiconductor light-emitting device 100 comprises the semiconductor laser device 1 and a package 10 in a predetermined shape covering the semiconductor laser device 1. The package 10 includes a supporting disk 11 and a cylindrical lid 12 to be attached to the supporting disk 11. One end of the lid 12 in a longitudinal direction is closed but has a window 12a through which a laser beam emitted from the semiconductor laser device 1 passes to the outside of the package 10. The lid 12 is made of a metal such as copper (Cu) or iron (Fe) and the window 12a is made of a transparent glass or resin. The supporting disk 11 is made of a metal such as copper or iron and the semiconductor laser device 1 is formed on a surface of the supporting disk 11 (the front face in FIG. 1). Here, the semiconductor laser device 1 corresponds to one specific example of "semiconductor laser device" of the present invention.

Figure 2:
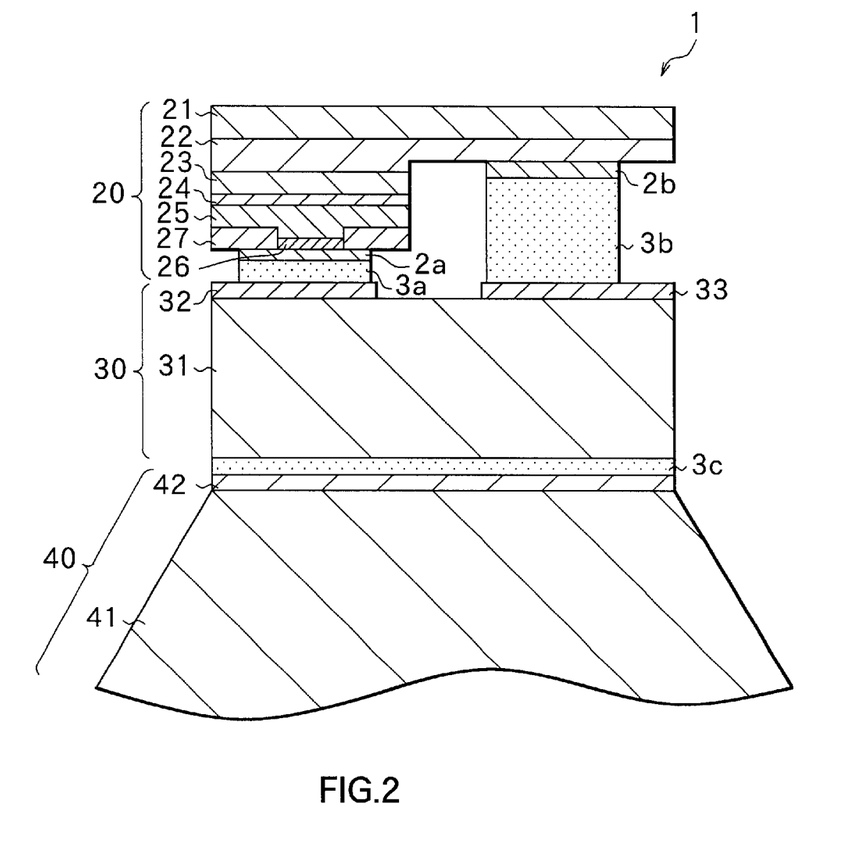
FIG. 2 is a cross section showing the structure of the semiconductor laser device in the semiconductor light-emitting device shown in FIG. 1.

FIG. 2 is a cross section of the structure of the semiconductor laser device 1. The semiconductor laser device 1 comprises a laser chip 20 including a semiconductor layer, a sub-mount 30 on which the laser chip 20 is mounted, and a heat sink 40 which supports the semiconductor laser device 1 and the sub-mount 30. The heat sink 40 is made of a metal with high thermal conductivity and releases heat generated by the laser chip 20. The sub-mount 30 is provided between the laser chip 20 and the heat sink 40 and has lead electrode layers 32 and 33, each of which is connected to each of electrodes 2a and 2b of the laser chip 20 to be described later. Here, the laser chip 20 corresponds to one specific example of "laser chip" of the present invention. The sub-mount 30 corresponds to one specific example of "mounting plate" of the present invention. The heat sink 40 corresponds to one specific example of "supporting plate" of the present invention. In FIG. 2 and FIGS. 3 through 7 to be described later, sizes of the laser chip 20, the sub-mount 30 and the heat sink 40 along the thickness are emphasized.

Figure 3:
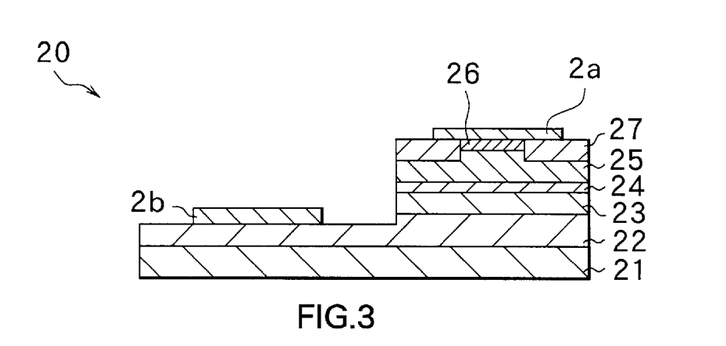
FIG. 3 is a cross section showing the structure of a laser chip of the semiconductor laser device shown in FIG. 1.

FIG. 3 is a cross section showing the structure of the laser chip 20 of the semiconductor laser device 1 shown in FIG. 2. The laser chip 20 includes a crystalline substrate 21 made of sapphire ($Al_2O_3$). The crystalline substrate 21 may be made of spinel ($MgAl_2O_4$), gallium nitride (GaN), silicon (Si) or silicon carbide (SiC) instead of sapphire. Formed on a surface of the crystalline substrate 21 is an n-type contact layer 22 made of n-type GaN in which n-type impurities, e.g., silicon are doped. The thickness of the n-type contact layer 22 is about 4 μm, for example. Formed on a surface of the n-type contact layer 22 is an n-type cladding layer 23 made of n-type AlGaN in which n-type impurities, e.g., silicon are doped. The thickness of the n-type cladding layer 23 is about 1.2 μm, for example.

An active layer 24 made of InGaN is formed on a surface of the n-type cladding layer 23. The active layer 24 acts as a so called light-emitting layer, for example, having a light-trapping layer. Formed on a surface of the active layer 24 is a p-type cladding layer 25 made of p-type AlGaN in which p-type impurities, e.g., Mg are doped. The thickness of the p-type cladding layer 25 is about 0.8 μm, for example. Formed on a surface of the p-type cladding layer 25 is a p-type contact layer 26 made of p-type GaN in which p-type impurities, e.g., Mg are doped. The thickness of the p-type contact layer 26 is about 0.3 μm, for example. A part of the p-type cladding layer 25 and the p-type cladding layer 26 is etched. A restricting layer 27 made with an insulating film such as silicon oxide or alumina ($Al_2O_3$) is provided so as to sandwich the p-type cladding layer 25 and the p-type contact layer 26.

Formed on a surface of the p-type contact layer 26 is the p-side electrode 2a. The p-side electrode 2a is alloyed by sequentially stacking a nickel (Ni) layer and a gold (Au) layer from the side of the p-type contact layer 26 and then applying heat thereon, for example. A part of the n-type contact layer 22, the n-type cladding layer 23, the active layer 24, the p-type cladding layer 25 and the p-type contact layer 26 is etched and the n-type contact layer 22 is partly exposed. The n-side electrode 2b is formed on the exposed surface of the n-type contact layer 22. The n-side electrode 2b is alloyed, for example, by sequentially stacking a titanium (Ti) layer, an aluminum (Al) layer and a gold layer from the side of the n-type contact layer 22 and then applying heat thereon. The p-side electrode 2a and the n-side electrode 2b are formed in a belt-like shape extending in a direction perpendicular to the sheet of FIG. 2. The difference in height between the surface of the p-side electrode 2a and the surface of the n-side electrode 2b is about 3.5 μm, for example.

Here, the crystalline substrate 21 corresponds to one specific example of "substrate" of the present invention. The stack of layers from the n-type contact layer 22 to the p-type contact layer 26 including the restricting layer 27 corresponds to one specific example of "semiconductor layer" of the present invention. The p-side electrode 2a and the n-side electrode 2b correspond to one specific example of "a pair of electrode films" of the present invention.

A pair of reflecting mirror films (not shown) is formed on both ends of the laser chip 20 in a perpendicular direction to the sheet of FIG. 3. These reflecting mirrors have the structure of alternately stacking silicon dioxide films and zirconium oxide (ZrO) films, for example. Reflectance of one reflecting mirror is lower than that of the other reflecting mirror. The light generated in the active layer 24 is amplified by reciprocating between the pair of reflecting mirror films and thus the amplified light is emitted from one reflecting mirror films as a laser beam.

Figure 4:
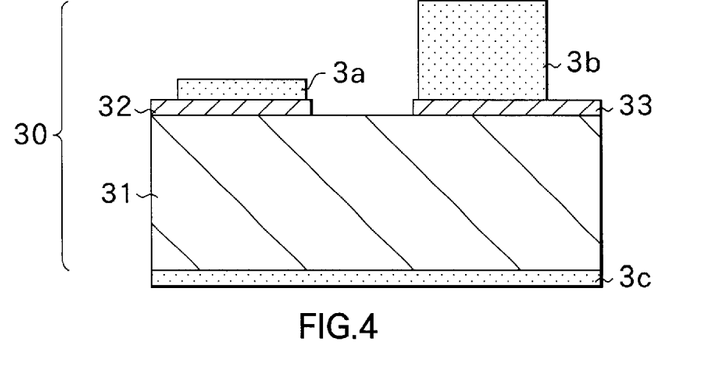
FIG. 4 is a cross section showing the structure of a mounting plate of the semiconductor laser device shown in FIG. 2.

FIG. 4 shows a cross section of the structure of the sub-mount 30. The sub-mount 30 has a structure such that the lead electrode layers 32 and 33, and front face solder films 3a and 3b are formed on a supporting body 31 in a rectangular plate shape. The supporting body 31 is made of insulating material with high thermal conductivity such as diamond (C), beryllium oxide (BeO), copper-tungsten alloy (CuW), aluminum nitride (AlN), cubic boron nitride (cBN), silicon (Si) or silicon carbide (SiC). The size of the supporting body 31 is 200 μm in thickness, 0.6 mm in width (length in the right-left direction in the drawing) and 1 mm in depth (length in the depth direction in the drawing), for example.

The supporting body 31 has an even top surface. A pair of lead electrode layers 32 and 33 of, e.g., 10 μm in thickness is formed on the even top surface of the supporting body 31. The lead electrode layers 32 and 33 may be formed of gold, gold-tin alloy (AuSn) or the like. The lead electrode layers 32 and 33 may have the structure of subsequently stacking a titanium layer, a platinum layer and a gold layer from the side of the sub-mount 30. As is shown in FIG. 1, the lead electrode layers 32 and 33 are electrically connected to pins 17 and 18 (FIG. 1) provided in the supporting disk 11 (FIG. 1) via wires W. respectively. Alternatively, one of the lead electrode layers 32 and 33 is electrically connected to a back face solder film 3c (FIG. 4) via a lead electrode (not shown). The left lead electrode layer 32 and the right lead electrode layer 33 are spaced about 50 μm. Here, the supporting body 31 corresponds to one specific example of "supporting body" of the present invention. The lead electrode layers 32 and 33 correspond to one specific example of "a pair of lead electrodes" of the present invention.

The front face solder films 3a and 3b are formed on surfaces of the lead electrode layers 32 and 33 in the sub-mount 30, respectively. The front face solder films 3a and 3b are formed of a metal with a low melting point such as tin (Sn), gold-tin alloy, tin-platinum alloy (SnPt), indium-tin alloy (InSn) and indium (In). The thickness of the front face solder film 3a in the left in FIG. 4 is about 3.5 μm, whereas the thickness of the front face solder film 3b in the right in FIG. 4 is about 7 μm. That is, the difference in height between the surface of the front face solder film 3a and the surface of the front face solder film 3b is about 3.5 μm. Here, each of the front face solder films 3a and 3b correspond to one specific example of "first solder film" of the present invention.

The back face solder film 3c is formed on the back surface (the opposite surface to the surface where the lead electrode layers 32 and 33 are formed) of the supporting body 31 in the sub-mount 30. The back face solder film 3c is formed of a metal with a low melting point such as tin similar to the front face solder films 3a and 3b and the thickness is about 4 μm. The back face solder film 3c is provided on the sub-mount 30 since it is easier than providing a solder on a structure such as the heat sink 40 (FIG. 5).

Figure 5:
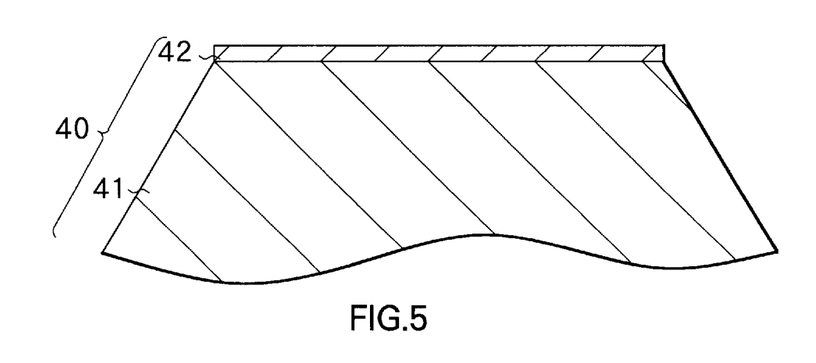
FIG. 5 is a cross section showing the structure of a supporting plate of the semiconductor laser device shown in FIG. 2.

FIG. 5 is a cross section showing the structure of the heat sink 40. The heat sink 40 has a structure such that a gold layer 42 is formed on a surface of a body 41 made of a metal with high thermal conductivity such as copper by means of plating. The body 41 in FIG. 5 is trapezoidal but may have different shapes. The gold layer 42 is provided in the heat sink 40 because the back face solder film 3c made of tin or the like is easily alloyed with the gold layer 42. Further, gold is a stable metal and an unwanted oxide film is hardly formed on a surface of the gold layer 42.

Method of Manufacturing a Semiconductor Laser Device

A method of manufacturing a semiconductor laser device of the embodiment will be described hereinafter.

First, the laser chip 20 shown in FIG. 3 is formed. More specifically, the n-side contact layer 22 made of n-type GaN, the n-type cladding layer 23 made of n-type AlGaN, the active layer 24 made of GaIn-N, the p-type cladding layer 25 made of p-type AlGaN, and the p-side contact layer 26 made of p-type GaN are grown in sequence on the surface of the crystalline substrate 21 made of, e.g., sapphire with a metal organic chemical vapor deposition (MOCVD) method.

After growing layers from the n-side contact layer 22 to the p-side contact layer 26, the p-type contact layer 26 and the p-type cladding layer 25 are partly etched with a lithography method and the restricting layer 27 made with, e.g., an insulating material is formed thereon. Subsequently, the p-side contact layer 26, the p-type cladding layer 25, the active layer 24 and the n-type cladding layer 23 are selectively removed to expose the n-side contact layer 22. Thereafter, the n-side electrode 2b is selectively formed on the exposed area of the n-side contact layer 22 and then the p-side electrode 2a is selectively formed on the p-side contact layer 26.

After forming the p-side electrode 2a and the n-side electrode 2b, the crystalline substrate 21 is cut vertically to the direction along the length of the p-side electrode 2a (in a vertical direction to the sheet of FIG. 3) with a predetermined width. After that, a pair of reflecting mirror films is formed on a pair of side surfaces of the cut semiconductor layer, respectively, and then the crystalline substrate 21 is cut parallel to the direction along the length of the p-side electrode 2a with a predetermined width. Thus, the laser chip 20 is formed.

Next, the sub-mount 30 shown in FIG. 4 is formed. More specifically, the lead electrode layers 32 and 33 are formed on the surface of the supporting body 31 made of, for example, diamond, beryllium oxide, copper-tungsten alloy, aluminum nitride, cBN, silicon or silicon carbide by means of plating, sputtering, or deposition. Subsequently, the front face solder films 3a and 3b made of a metal with a low melting point is formed on the surfaces of lead electrode layers 32 and 33 by means of deposition. The back face solder film 3c made of a metal with a low melting point is formed on the back surface of the supporting body 31 by means of deposition method. Accordingly, the sub-mount 30 including the front face solder films 3a and 3b and the back face solder film 3c is formed.

The heat sink 40 shown in FIG. 5 is formed. Specifically, the gold layer 42 is formed on the surface of the body 41 made of metal, for example, by means of plating. The heat sink 40 is integrally formed with the supporting disk 11 (FIG. 1) or previously mounted to the supporting disk 11.

Figure 6:
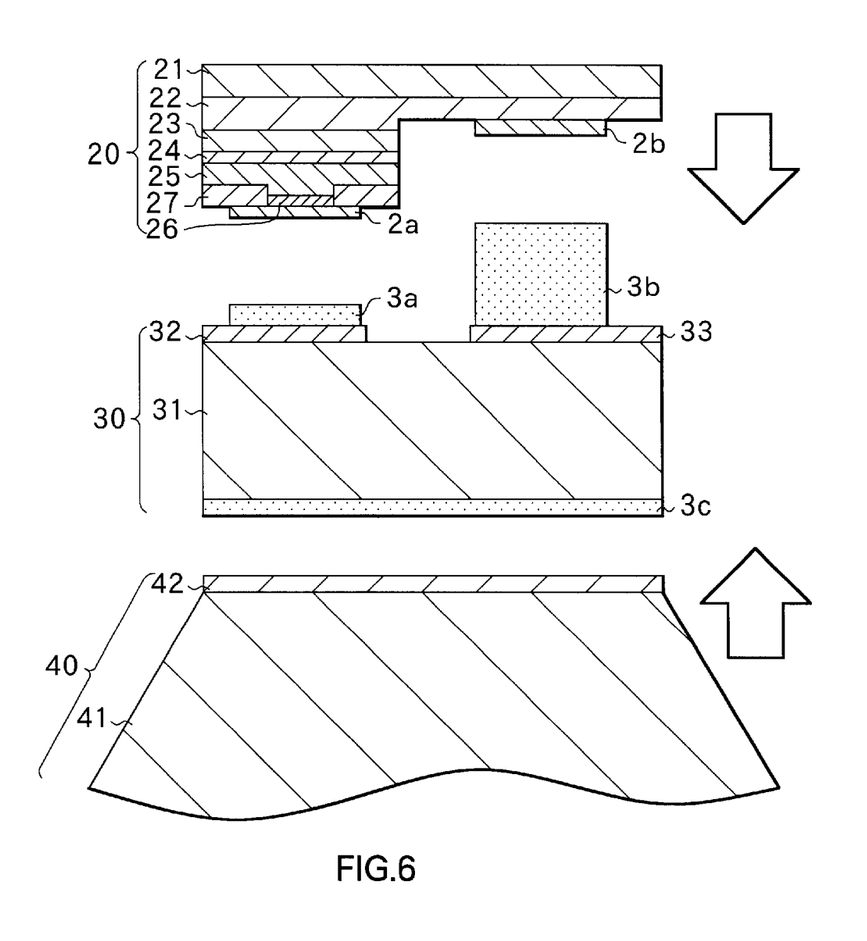
FIG. 6 is a cross section showing an adhesion process in the method of manufacturing a semiconductor laser device shown in FIG. 2.

As shown in FIG. 6, the laser chip 20, the sub-mount 30 and the heat sink 40 are put together. At this time, since the front face solder films 3a and 3b and the back face solder film 3c are formed on the front and back surfaces of the sub-mount 30, the front face solder films 3a and 3b are positioned between the laser chip 20 and the sub-mount 30, and the back face solder film 3c is positioned between the sub-mount 30 and the heat sink 40. In this state, the laser chip 20, the sub-mount 30 and the heat sink 40 are stacked and then heat and pressure are applied thereon. The weight for the application of pressure is about 5 g, for example. The pressure applied per unit area of the laser chip 20 is calculated to be about $1.2 \times 10^{-4}$ Pa. The temperature for the application of heat is, e.g., about 280° C. in order to melt the front face solder films 3a and 3b and the back face solder film 3c. The process of the application of heat and pressure is preferably performed in a nitrogen gas ($N_2$) or hydrogen gas ($H_2$) or mixed gas of the nitrogen gas and hydrogen gas atmosphere in order to avoid oxidation of the solder films 3a and 3b.

Thus, as shown in FIG. 2, the front face solder films 3a and 3b adhere the laser chip 20 to the sub-mount 30, while the back face solder film 3c adheres the sub-mount 30 to the heat sink 40. The p-side electrode 2a and the n-side electrode 2b of the laser chip 20 are electrically coupled to the lead electrode layers 3a and 3b of the sub-mount 30, respectively. In this manner, the laser chip 20, the sub-mount 30 and the heat sink 40 simultaneously adhere to each other and become an integral unit. Subsequently, the lead electrode layers 32 and 33 in the sub-mount 30 are connected to the pins 17 and 18 (FIG. 1) provided in the supporting disk 11 (FIG. 1) through wires (not shown), respectively. Thus, the semiconductor light-emitting device 100 shown in FIG. 1 is manufactured.

Effects of the Embodiment

The effects of the embodiment will be described herein later. As shown in FIG. 6, the laser chip 20, the sub-mount 30 and the heat sink 40 adhere to each other simultaneously, whereby time required for manufacture is reduced as compared to the case where a process for adhesion of the laser chip 20 and the sub-mount 30 and a process for adhesion of the sub-mount 30 and the heat sink 40 are separately performed. Further, heating is performed only one time, so that deterioration in performance of the laser chip 20 due to repetition of heating is suppressed.

Since the front face solder films 3a and 3b and the back face solder film 3c are provided on the front and back surfaces of the sub-mount 30, by only applying heat and pressure on the stacked laser chip 20, the sub-mount 30 and the heat sink 40, the laser chip 20, the sub-mount 30 and the heat sink 40 become an integrated unit, whereby the manufacturing process can be made easier. Since all solder films (the front solder films 3a and 3b and the back solder film 3c), which are easy to oxidize, are provided on the sub-mount 30, only the sub-mount 30 needs to be controlled for prevention of oxidation, which facilitates parts control.

With the embodiment, after stacking the laser chip 20, the sub-mount 30 and the heat sink 40, pressure, e.g., 5 g is applied thereon. The effects of application of pressure will be described below. When thermal resistance of the semiconductor laser device 1 manufactured in the embodiment was measured, the thermal resistance was 12 K/W. That is, 12 K (kelvin) increased per application of 1 W of heat. On the other hand, the semiconductor laser device was formed in such a manner that the laser chip 20, the sub-mount 30 and the heat sink 40 adhere to each other without applying pressure. The thermal resistance was measured to be 28 K/W. Judging from the measurement results, application of pressure on the laser chip 20, the sub-mount 30 and the heat sink 40 achieves smaller thermal resistance (that is, smaller temperature increase per application of a fixed quantity of heat) as compared to the case where no pressure is applied. As described with the method of manufacturing a semiconductor laser device of the embodiment, by achieving smaller thermal resistance, life of the semiconductor device becomes longer and further certain performance is maintained for a long period of time.

When life of the semiconductor laser device 1 manufactured in the embodiment and life of the semiconductor laser device manufactured without applying pressure are measured, the life of the semiconductor laser device 1 manufactured in the embodiment is 2.5 times longer than that of the semiconductor laser device manufactured without application of pressure.

Modification

Figure 7:
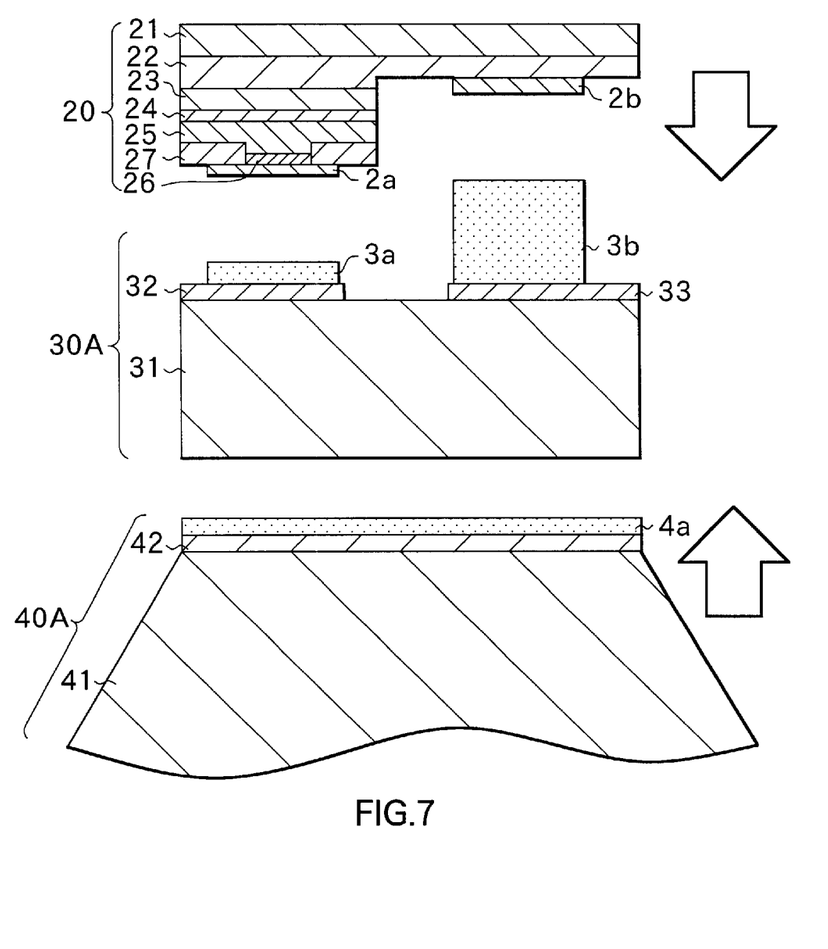
FIG. 7 is a cross section for describing the method of manufacturing a semiconductor laser device of a modification of the embodiment according to the invention.

FIG. 7 shows a modification of the method of manufacturing a semiconductor laser device of the embodiment. With the modification, instead of forming the solder films on the front and back surfaces of the sub-mount 30A, solder films are formed on a surface of the sub-mount 30A and a surface of the heat sink 40A. The same elements as those of the first embodiment are indicated by the same reference numerals herein later and the description is omitted.

As shown in FIG. 7, the front face solder films 3a and 3b are formed on the surface of the supporting body 31 of the sub-mount 30A (on the lead electrode layers 32 and 33), and no back face solder film 3c (FIG. 4) as in the first embodiment is provided on the back surface of the sub-mount 30A. However, a heat-sink-side solder film 4a made of a metal with a low melting point such as tin is formed on the surface of the gold layer 42 of the heat sink 40A. The structure of the laser chip 20 is the same as the structure of the laser chip 20 in the first embodiment. Here, the heat-sink-side solder film 4a corresponds to one specific example of "second solder film" of the present invention.

Thus structured the laser chip 20, the sub-mount 30A and the heat sink 40A are stacked and heat and pressure are applied thereon similar to the first embodiment. Therefore, the front face solder film 3a adheres the laser chip 20 to the sub-mount 30A, whereas the heat-sink-side solder film 4a adheres the sub-mount 30A to the heat sink 40A. Thus, with this modification similar to the first embodiment, the laser chip 20, the sub-mount 30A and the heat sink 40A adhere to each other simultaneously, which reduces time required for manufacture. Moreover, repetition of heating is unnecessary with the modification, whereby deterioration in performance of the laser chip 20 due to heat is suppressed.

Although the present invention has been described by exemplifying the embodiment and the modification of the present invention, the present invention is not limited to the embodiment and the modification and various other modifications are possible. For example, with the first embodiment, the front face solder films 3a and 3b and the back face solder film 3c are formed on the front and back surfaces of the sub-mount 30. However, the front face solder films 3a and 3b and the back face solder film 3c may be formed taking the shape of a foil and the foils may be inserted between the laser chip and the mounting plate and between the mounting plate and the supporting plate, respectively. Various structures of the semiconductor light-emitting device 100 are possible in addition to the one shown in FIG. 1.

As described above, according to the method of manufacturing a semiconductor laser device of the invention, the laser chip, the mounting plate and the supporting plate adhere to each other simultaneously, so that the manufacturing process can be facilitated as compared to the case where the mounting plate adheres to the supporting plate and then the laser chip adheres to the mounting plate. Further, when heating is applied in the adhesion process, repetition of heating is unnecessary, whereby deterioration in performance of the laser chip due to heat is suppressed.

According to the method of manufacturing a semiconductor laser device of one aspect of the invention, the first solder film is provided between the laser chip and the mounting plate and the second solder film is provided between the mounting plate and the supporting plate. Thus, the laser chip, the mounting plate and the supporting plate adhere to each other simultaneously with a simple method.

According to the mounting plate of the semiconductor laser device of the invention, the first solder film and the second solder film are provided on the pair of surfaces of the mounting plate, respectively, so that the semiconductor laser device is easily formed by placing the laser chip on one surface of the mounting plate and placing the supporting plate on the other surface of the mounting plate.

According to the supporting plate of the semiconductor laser device of the invention, the solder film is provided at least on one surface of the supporting plate, whereby the semiconductor laser device is easily formed by placing the mounting plate on the supporting plate and placing the laser chip on the mounting plate (having the solder film and the like in between) and then applying heat and pressure as needed.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a semiconductor laser device, comprising the steps of:
providing a laser chip, a supporting plate which supports the laser chip, a mounting plate, a first solder film positioned between the laser chip and the mounting plate and a second solder film positioned between the mounting plate and the supporting plate to form a stacked laser chip structure;
applying heat at a temperature of approximately 280° C. to the stacked laser chip structure sufficient to melt the first solder film and the second solder film; and applying pressure of approximately $1.2 \times 10^{-4}$ Pa to the stacked laser structure during the heating step to cause simultaneous adhering of the laser chip, the mounting plate and the supporting plate to each other thereby suppressing deterioration in performance of the semiconductor laser device due to excessive heating of the stacked laser chip structure.

2. A method of manufacturing a semiconductor laser device according to claim 1, wherein the first solder film and the second solder film are formed on a pair of surfaces of the mounting plate, respectively.

3. A method of manufacturing a semiconductor laser device according to claim 1, wherein the first solder film is formed on a surface of the mounting plate, and the second solder film is formed on a surface of the supporting plate.

4. A method of manufacturing a semiconductor laser device according to claim 1, wherein the first solder film and the second solder film are made with the same material.

5. A method of manufacturing a semiconductor laser device according to claim 1, wherein a surface, of the laser chip adheres to the mounting plate in the adhesion step.

6. A method of manufacturing a semiconductor laser device according to claim 5, wherein a pair of electrode films are provided on the surface in which the semiconductor layer is formed in the laser chip.

7. A method of manufacturing a semiconductor laser device according to claim 6, wherein a pair of lead electrodes are provided on the surface to which the laser chip adheres in the mounting plate, the pair of lead electrodes being connected to the pair of electrode films.

8. A method of manufacturing a semiconductor laser device according to claim 4, wherein the laser chip has a semiconductor layer including a layer made of a nitride semiconductor in the laser chip.

9. A method of manufacturing a semiconductor laser device, comprising the steps of:

arranging a laser chip, a mounting plate and a supporting plate with a first adhering material disposed between the laser chip and the mounting plate and a second adhering material disposed between the mounting plate and the supporting plate to form a stacked structure; and applying pressure of approximately $1.2 \times 10^{-4}$ Pa to the stacked structure and applying heat at a temperature of approximately 280° C. to the stacked structure to cause the laser chip, the mounting structure and the supporting plate to simultaneously adhere to each other as a unitary stacked structure, wherein the steps of applying pressure and heat are conducted simultaneously when applied to the stacked structure thereby suppressing deterioration in performance of the semiconductor laser device due to excessive heating of the stacked structure.

10. A method of manufacturing a semiconductor laser device according to claim 9, further comprising the step of applying sufficient heat to the stacked structure.

11. A method of manufacturing a semiconductor laser device according to claim 10, wherein the steps of applying sufficient pressure and sufficient heat are conducted simultaneously when applied to the stacked structure.

12. A method of manufacturing a semiconductor laser device according to claim 9, wherein at least one of the first and second adhering materials is a solder film.

* * * * *